United States Patent
Samih et al.

(10) Patent No.: US 12,417,817 B1
(45) Date of Patent: Sep. 16, 2025

(54) STACKED 3D MEMORY ARCHITECTURE FOR POWER OPTIMIZATION

(71) Applicant: Meta Platforms Technologies, LLC, Menlo Park, CA (US)

(72) Inventors: Ahmad Abdel Rauof Samih, Austin, TX (US); Daniel Henry Morris, Mountain View, CA (US); Hadi Asgharimoghaddam, Kirkland, WA (US); Pietro Caragiulo, Palo Alto, CA (US); Vamshi Krishna Lakkaraju, Chandler, AZ (US); Vivek Venkatesan, Pleasanton, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 238 days.

(21) Appl. No.: 18/298,779

(22) Filed: Apr. 11, 2023

(51) Int. Cl.
  *G11C 11/00* (2006.01)
  *G06F 13/16* (2006.01)
  *G11C 29/00* (2006.01)

(52) U.S. Cl.
  CPC .......... *G11C 29/83* (2013.01); *G06F 13/1668* (2013.01); *G11C 29/785* (2013.01)

(58) Field of Classification Search
  CPC .... G11C 29/82; G11C 29/785; G06F 13/1668
  See application file for complete search history.

(56) References Cited

U.S. PATENT DOCUMENTS

| | | |
|---|---|---|
| 5,799,207 A | 8/1998 | Wang et al. |
| 6,158,040 A | 12/2000 | Ho |
| 10,579,425 B1 * | 3/2020 | Jacob ................ G06F 9/4843 |
| 2002/0001218 A1 | 1/2002 | Konishi |
| 2003/0033493 A1 | 2/2003 | Cismas |
| 2003/0110350 A1 | 6/2003 | McGee et al. |
| 2005/0242831 A1 | 11/2005 | Linam |
| 2006/0200597 A1 | 9/2006 | Christenson et al. |
| 2011/0164460 A1 | 7/2011 | Kajigaya et al. |
| 2013/0254473 A1 | 9/2013 | Bartley et al. |
| 2015/0006924 A1 | 1/2015 | Jain et al. |
| 2016/0124873 A1 | 5/2016 | Xu et al. |
| 2017/0063564 A1 | 3/2017 | Kumar et al. |

(Continued)

OTHER PUBLICATIONS

Final Office Action mailed May 8, 2025 for U.S. Appl. No. 18/298,869, filed Apr. 11, 2023, 24 pages.

*Primary Examiner* — Pho M Luu
(74) *Attorney, Agent, or Firm* — Morgan, Lewis & Bockius LLP

(57) ABSTRACT

A headset includes a camera a 3D stacked memory configured to store image data captured by the camera, and a System-on-Chip (SoC) configured to process the image data stored in the 3D stacked memory. The 3D stacked memory includes a plurality of first drivers/receivers and a plurality of memory banks that are accessible in parallel. Each memory bank is accessible via a corresponding first driver/receiver. The SoC includes a memory controller with a plurality of second drivers/receivers. The plurality of the second drivers/receivers of the SoC are respectively connected to the plurality of the first drivers/receivers of the 3D stacked memory by a plurality of channels. The SoC and the 3D stacked memory are vertically stacked together. The plurality of the memory banks include at least eight memory banks.

20 Claims, 8 Drawing Sheets

(56) References Cited

U.S. PATENT DOCUMENTS

| | | |
|---|---|---|
| 2017/0220411 A1 | 8/2017 | Bedeschi |
| 2017/0300270 A1 | 10/2017 | Bains et al. |
| 2018/0052766 A1 | 2/2018 | Mehra et al. |
| 2018/0270441 A1 | 9/2018 | Van Geel et al. |
| 2018/0329839 A1 | 11/2018 | Durbhakula |
| 2019/0033949 A1 | 1/2019 | McIlvain et al. |
| 2020/0006306 A1 | 1/2020 | Li |
| 2020/0192454 A1* | 6/2020 | de Rochemont ... G06F 12/0815 |
| 2024/0370331 A1* | 11/2024 | Song .................. G06F 11/1068 |

* cited by examiner

Traffic Profiles for Four Clusters in a NoC Architecture

Cluster 1

| Virtual Initiators | Rd BW (MB/s) | Wr BW (MB/s) |
|---|---|---|
| Computer Vision (IP1) | [2000...3000] | [500...1000] |
| Computer Vision (IP2) | [300...600] | [25...100] |
| Computer Vision (IP3) | [300...600] | [300...600] |
| Computer Vision (IP4) | [2000...3000] | [1000...2000] |
| Neural Network Engine | [1000...2000] | [25...100] |
| Total | [5600...12200] | [1850...3800] |

Cluster 2

| Virtual Initiators | Rd BW (MB/s) | Wr BW (MB/s) |
|---|---|---|
| Video Decoder | [1000...2000] | [300...600] |
| Rendering (remote--IP1) | [25...100] | [300...600] |
| Rendering (remote--IP2) | [25...100] | [300...600] |
| Display (L Eye--IP1) | [4000...7000] | [25...100] |
| Display (L Eye--IP2) | [2000...3000] | [25...100] |
| Total | [7050...12200] | [950...2000] |

Cluster 3

| Virtual Initiators | Rd BW (MB/s) | Wr BW (MB/s) |
|---|---|---|
| Video Encoder | [1000...2000] | [300...600] |
| Computer Vision (IP5) | [1000...2000] | [1000...2000] |
| Rendering (IP1) | [600...1200] | [25...100] |
| Audio | [500...1000] | [25...100] |
| Communication | [500...1000] | [500...1000] |
| Total | [3600...7200] | [1850...3800] |

Cluster 4

| Virtual Initiators | Rd BW (MB/s) | Wr BW (MB/s) |
|---|---|---|
| Video Decoder (remote) | [25...100] | [300...600] |
| Rendering (remote--IP1) | [25...100] | [300...600] |
| Rendering (IP2) | [500...1000] | [300...600] |
| Display (R Eye--IP1) | [4000...7000] | [25...100] |
| Display (R Eye--IP2) | [2000...3000] | [25...100] |
| Total | [6550...11200] | [950...2000] |

*FIG. 7*

STACKED 3D MEMORY ARCHITECTURE FOR POWER OPTIMIZATION

TECHNICAL FIELD

This disclosure generally relates to an artificial reality device including a three-dimensional (3D) stacked memory, and in particular relates to using the 3D stacked memory to reduce power consumption of an artificial reality device.

BACKGROUND

Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. An artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers. 3D integrated circuit manufacturing technology may be developed with two or more dice stacked vertically in a 3D structure chip architecture with high storage capacity. Stacking of multiple memory chips increases chip density, provides a reduction in overall package, and improves electrical performance. A 3D stacked dynamic random access memory (DRAM) may be used with processors or memory controllers to implement applications on virtual reality (VR) and augmented reality (AR) devices. AR/VR devices require less power consumption and smaller chip size to enable high-resolution and long duration image capture on significantly power constrained wearable devices. An artificial reality device with a 3D stacked memory requires less power consumption for signal transmission with low data latency.

SUMMARY OF PARTICULAR EMBODIMENTS

Embodiments of this invention may include or be implemented in conjunction with an artificial reality device (e.g., a headset) with a 3D stacked memory. Embodiments of the invention may provide solutions to reduce energy consumption using a customized 3D die-stacking mechanism. Embodiments of the invention may include a customized 3D stacked memory with a memory page configuration and a low power DRAM die, a customized Network-on-Chip (NoC) architecture, a customized memory controller, or a combination of two or more of these.

In particular embodiments, artificial reality devices and methods are described for using 3D stacked memory to reduce power consumption of an artificial reality device such as a headset. The headset comprises a camera, a 3D stacked memory configured to store image data captured by the camera, and a System-on-Chip (SoC) configured to process the image data stored in the 3D stacked memory. The 3D stacked memory comprises a plurality of first drivers/receivers and a plurality of memory banks that are accessible in parallel. Each memory bank is accessible via a corresponding first interconnect. The SoC comprises a memory controller with a plurality of second drivers/receivers. The plurality of the second drivers/receivers are respectively connected to the plurality of the first drivers/receivers of the 3D stacked memory by a plurality of channels. In particular embodiments, the SoC and the 3D stacked memory are vertically stacked together. The plurality of the memory banks each has a page size of 512 bytes or less. The plurality of the memory banks include at least eight memory banks. The plurality of the channels are controlled by using unidirectional and/or bidirectional links. Each channel may operate at 500 MHz or less. In particular embodiments, the memory controller of the SoC does not use a physical interface (PHY) circuitry to access the 3D stacked memory. The 3D stacked memory does not use a Double Data Rate (DDR) interface and it does not require to perform impedance matching when transferring stream data from the plurality of memory banks to the SoC.

In particular embodiments, artificial reality devices and methods are described for using a network-on-chip (NoC) architecture to handle multi-channel 3D stacked memory of an artificial reality device such as a headset. In particular embodiments, the headset comprises a 3D stacked memory and a System-on-Chip (SoC). The 3D stacked memory comprises a plurality of memory banks that are accessible in parallel. The SoC comprises a plurality of memory controllers and a network-on-chip (NoC). The NoC comprises a plurality of routers and each router is connected to a plurality of channels. Each memory controller is configured to access the 3D stacked memory via a channel. Each memory controller is respectively connected to a cluster of memory banks. The SoC is configured to determine a channel bandwidth capacity of each channel associated with each cluster; determine a first bandwidth demand for a first set of applications of a subsystem from a first channel associated with a first cluster; and determine whether the first bandwidth demand of the first set of the applications is less than a first channel bandwidth capacity. In response to determining that the first bandwidth demand of the first set of applications of the subsystem is less than the first channel bandwidth capacity, the SoC is configured to partition the first bandwidth demand to one or more memory banks of the first cluster based on a bandwidth demand of each application in the first set of applications and the first channel bandwidth capacity. The SoC is configured to allocate the first set of the applications to the one or more memory banks of the first cluster to maximize a bandwidth usage of at least one memory bank of the first cluster. In particular embodiments, the SoC is further configured to determine an affinity score between an application producer and a user of data associated with the application; partition the first bandwidth demand to one or more memory banks of the first cluster based on a ranking of one or more affinity scores and the bandwidth demand of each application; and allocate the first set of the applications to the one or more memory banks of the first cluster to maximize a bandwidth usage of at least one memory bank in the first cluster.

In particular embodiments, artificial reality devices and methods are described for achieving high efficiency on a 3D stacked memory an artificial reality device such as a headset. The headset comprises a camera, a 3D stacked memory configured to store image data captured by the camera, and a System-on-Chip (SoC). The 3D stacked memory comprises a plurality of memory banks that are accessible in parallel via the plurality of channels. The SoC comprises a plurality of memory controllers and a network-on-chip (NoC). The SoC and the 3D stacked memory are vertically stacked together. In particular embodiments, each cluster comprises four memory banks. Each memory bank has a page size of 512 bytes or less. The NoC comprises a plurality of routers. Each router is connected to the plurality of the channels. Each memory controller is associated with a channel and is connected to a cluster of memory banks. Each memory controller is configured to operate as an out-oforder scheduler to access each respective memory bank via a channel. The out-of-order scheduler is configured to generate a schedule with an out-of-order sequence of read commands or write commands to control operations of a set of memory banks in each cluster. In particular embodiments, the memory controller of the SoC does not use a physical interface (PHY) circuitry to access the 3D stacked memory. The 3D stacked memory does not use a Double Data Rate (DDR) interface and it does not require to perform impedance matching when transferring stream data from the plurality of the memory banks to the SoC. In particular embodiments, each out-of-order scheduler may be further configured to select a memory bank based on a priority of a transaction type associated with each corresponding transaction through the channel; prioritize a set of pages of the memory bank associated with the transaction having a higher priority; and schedule an operation to open the set of pages of the memory bank. In one embodiment, each out-of-order scheduler may be further configured to select a memory bank based on page status, such as open or closed status. In one embodiment, each out-of-order scheduler may be further configured to select a memory bank based on a request associated with a page of a memory bank. In one embodiment, each out-of-order scheduler may be further configured to select a memory bank based on a data transfer direction.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in particular embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

In particular embodiments, embodiments of the invention may include a variety of subsystems performing methods and functions of artificial reality devices, such as a headset as described herein. The various subsystems may include specialized hardware and integrated circuits and software instructions to facilitate the functions of the headset. In particular embodiments, the subsystems may be functional subsystems operating on one or more processors or memory controllers to execute the software instructions or integrated circuits of the headset. Thus, these are not limited to separate hardware components and software instructions of the headset to implement the solutions as described herein. In particular embodiments, embodiments of the invention may present comprehensive solutions to reduce power consumption in the 3D stacked memory and achieve power efficient data transmission between the 3D stacked memory and the SoC, further improve industrial design of the artificial reality devices. For example, the customized 3D stacked memory may be used in AR applications and devices, computer vision subsystems, or Point of View (PoV) camera subsystems. The customized 3D stacked memory can be used to enable high resolution and long duration captures with limited AR device power budget.

The embodiments disclosed herein are only examples, and the scope of this disclosure is not limited to them. Particular embodiments may include all, some, or none of the components, elements, features, functions, operations, or steps of the embodiments disclosed herein. Embodiments according to the invention are in particular disclosed in the attached claims directed to a device and a method, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

BRIEF DESCRIPTION OF THE DRAWINGS

FIG. 7 is a diagram illustrating a traffic profile for each cluster corresponding to the example NoC architecture in FIG. 5 and the method in FIG. 6.

DESCRIPTION OF EXAMPLE EMBODIMENTS

Figure 1:
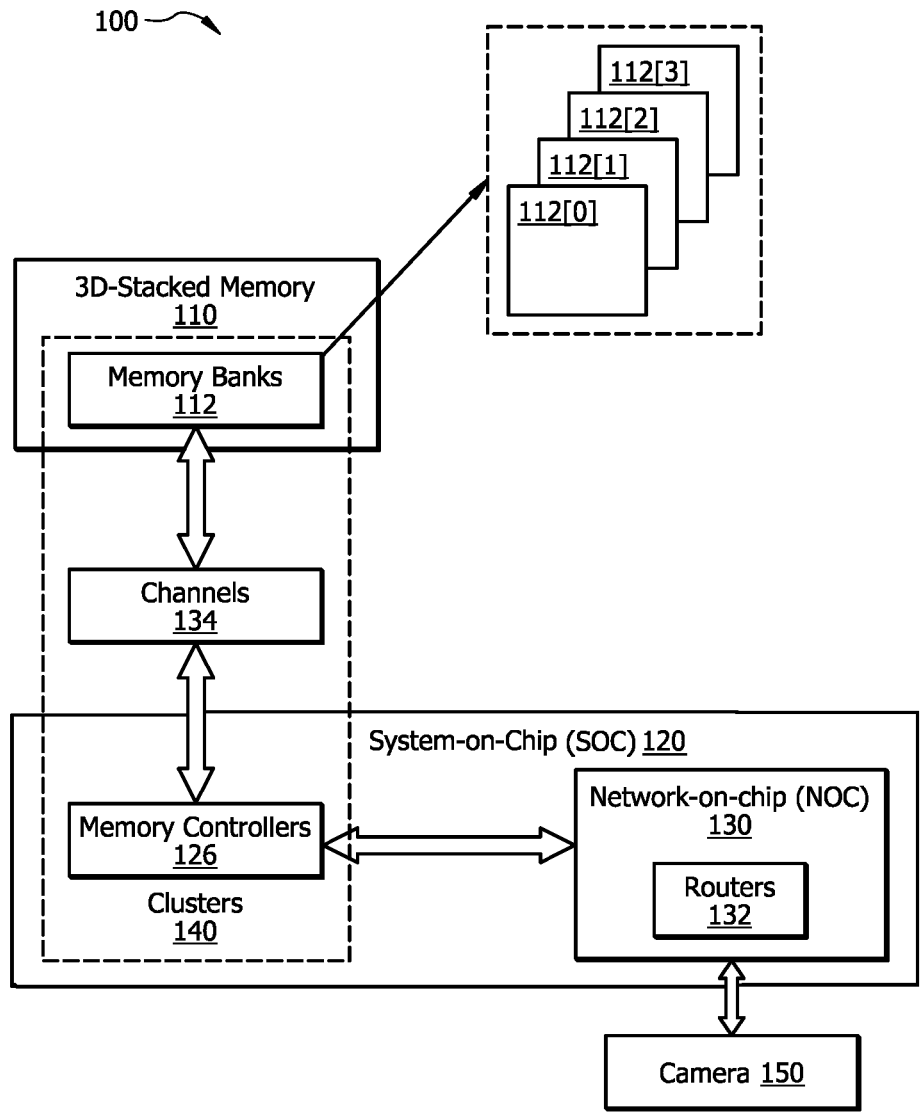
FIG. 1 is a diagram illustrating a structure of an example headset with a 3D stacked memory and a System-on-Chip (SoC).

In particular embodiments, embodiments of the disclosure may include a customized 3D stacked memory with a memory page configuration and a low power DRAM die, a customized NoC architecture, a customized memory controller, or a combination of two or more of these. Artificial reality devices and methods described herein may present a comprehensive solution to reduce power consumption in the 3D stacked memory, achieve power efficient data transmission between a 3D stacked memory and a System-on-Chip (SoC), and further improve industrial design of the artificial reality devices.

In particular embodiments, artificial reality devices and methods may provide a headset which includes a customized 3D stacked memory with a memory page configuration and a low power DRAM die for reducing power consumption of a headset. The headset comprises a camera, a 3D stacked memory configured to store image data captured by the camera, and a System-on-Chip (SoC) configured to process the image data stored in the 3D stacked memory. The 3D stacked memory comprises a plurality of first drivers/receivers and a plurality of memory banks that are accessible in parallel. Each memory bank is accessible via a corresponding first interconnect. The SoC comprises a memory controller with a plurality of second drivers/receivers. The plurality of the second drivers/receivers are respectively connected to the plurality of the first drivers/receivers of the 3D stacked memory by a plurality of channels. In particular embodiments, the SoC and the 3D stacked memory are vertically stacked together. The plurality of the memory banks each has a page size of 512 bytes or less. In particular embodiments, the plurality of the memory banks include at least eight memory banks. The plurality of the channels are controlled by using unidirectional and/or bidirectional links. Each unidirectional and/or bidirectional link may comprise a first driver/receiver, a Die-to-Die(D2D) interconnect, and a second driver/receiver. Each channel may operate at 500 MHz or less. In particular embodiments, the memory controller of the SoC does not use a physical interface (PHY) circuitry to access the 3D stacked memory. The 3D stacked memory does not use a Double Data Rate (DDR) interface and it does not require impedance matching when transferring data from the plurality of the memory banks to the SoC.

In particular embodiments, the SoC does not use a dedicated phase-locked loop (PLL) or a delay-locked loop (DLL) for reading data from the memory banks because the SoC operates at the same frequency as the SoC clock. The SoC and the 3D stacked memory operate at different voltages. The memory controller is configured to operate as a scheduler to select and send read commands or write commands to the memory bank. An areal density of the plurality of the number of the channels on the memory die is determined based at least in part on a threshold of a channel capacity and a predefined page size. The plurality of the memory banks is based at least in part on the number of the channels. The number of pages of each memory bank is determined based at least in part on the threshold of a channel capacity and the number of the channels. The number of the plurality of the first drivers/receivers is determined based at least in part on the page size of each memory bank and the areal density of the plurality of the first drivers/receivers on the memory die.

In particular embodiments, a memory die and a SoC die may be vertically stacked together through Die-to-Die (D2D) connections between a plurality of memory banks and the SoC. In particular embodiments, the short D2D interconnects may have a low capacitance value which may enable the use of low-power and low-voltage input-output drivers. For example, the short D2D interconnects may have a low capacitance value less than 1 pF. The plurality of the channels may be controlled by using unidirectional and/or bidirectional links. Each channel may operate at 500 MHz or less. Stream data may be multiple low-speed parallel stream data. Stream data may be transferred through the short D2D interconnects between the plurality of the memory banks and the SoC. The impedance matching is not needed for the low-speed interface and the short D2D interconnects between the plurality of the memory banks and the SoC.

In particular embodiments, the customized 3D stacked memory may have a small page size of the DRAM memory page of the DRAM on the memory die. The memory page configuration and the low power DRAM die may enable a low power consumption of the 3D stacked memory. The memory die may be a customized low power DRAM die. An areal density of number of the channels on the memory die may be determined based at least in part on a channel capacity threshold and a predefined page size. The plurality of the memory banks may be determined based at least in part on the number of the channels. The number of pages of each memory bank may be determined based at least in part on the channel capacity threshold and the number of the channels. The numbers of the plurality of the first drivers/receivers may be determined based at least in part on the page size of each memory bank and the areal density of the plurality of the first drivers/receivers on the memory die. A memory bank with the smaller page size may be implemented based on an areal density of the plurality of the first drivers/receivers on the memory die.

In particular embodiments, the customized 3D stacked memory may be used to reduce power consumption of an artificial reality device such as a headset. The customized 3D stacked memory with a memory page configuration may provide technical advantages to reduce page size of each memory bank. The customized 3D stacked memory may further lower the power consumption of the 3D stacked DRAM and data transmission between the plurality of the memory banks on the memory die and the SoC on the Soc die.

In particular embodiments, the plurality of the memory banks of the 3D stacked DRAM may each have a small page size of 512 B or less. The 3D stacked DRAM may statistically reduce data transferred through memory arrays of the 3D stacked memory. The 3D stacked DRAM with the small page size may significantly lower the activation power and reduce the number of banks to at least 8 memory banks used in the 3D stacked DRAM.

In particular embodiments, the data transferred between the 3D stacked DRAM and the SoC may be completed through a plurality of the low-speed channels with a 500 MHz bandwidth or less at a lower speed. This significantly reduces data movement inside the memory by using low power interconnects connected to the SoC with an efficient process. The 3D stacked DRAM does not constrain the location or pitch on the location of these connections compared to a memory interface of the WideIO2 architecture.

The low-speed interface does not require a PHY for serialization and deserialization. The data can be sent to the memory using a wide interface (>64 DQ per channel) composed of multiple channels instead of a single channel with low DQ count. The short D2D interconnects have a low capacitance profile (e.g., less than 1 pF) enabling the use of low-power and low-voltage input-output drivers. Impedance matching is not needed in the customized 3D stacked DRAM because of the low-speed interface and short D2D interconnects.

Another advantage of having low-speed interface is that the customized 3D stacked DRAM does not require any additional DLL/PLL inside the SoC to generate the high-speed clocks required for deserialization. These features enable power-efficient interface with the NoC rate matching.

In particular embodiments, artificial reality devices and methods may provide a customized NoC architecture configured to provide solutions to cluster the customized 3D stacked memory to maximize bandwidth and minimize cross cluster communications based on the type of memory and types of applications or services. The artificial reality devices and methods may provide solutions to dynamically allocate a set of the applications to the one or more memory banks of a cluster to maximize a bandwidth usage of at least one memory bank of the cluster. A headset may include a customized NoC architecture to handle multi-channel 3D stacked memory. The headset comprises a 3D stacked memory and a System-on-Chip (SoC). The 3D stacked memory comprises a plurality of memory banks that are accessible in parallel. The SoC comprises a plurality of memory controllers and a network-on-chip (NoC). The NoC comprises a plurality of routers and each router is connected to a plurality of channels. Each memory controller is associated with a channel and is connected to a cluster of memory banks. The SoC is configured to determine a channel bandwidth capacity of each channel associated with each cluster; determine a first bandwidth demand for a first set of applications from a first channel; determine whether the first bandwidth demand of the first set of the applications is less than a first channel bandwidth capacity of the first channel in a first cluster; in response to determining that the first bandwidth demand of the first set of applications is less than the first channel bandwidth capacity, partition the first bandwidth demand to one or more memory banks of the first cluster based on a bandwidth demand of each application in the first set of applications and the first channel bandwidth capacity; and allocate the first set of the applications to the one or more memory banks of the first cluster to maximize a bandwidth usage of at least one memory bank of the first cluster.

In particular embodiments, the SoC is further configured to determine an affinity score between an application producer and a user of data associated with the application; partition the first bandwidth demand to one or more memory banks of the first cluster based on a ranking of one or more affinity scores and the bandwidth demand of each application; and allocate the first set of the applications to the one or more memory banks of the first cluster to maximize a bandwidth usage of at least one memory bank in the first cluster.

In particular embodiments, the SoC is further configured to identify at least two applications which are initiated by a user associated with the same virtual initiator and transmitted by a router via different channels associated with a cluster; and enable channel interleaving to generate one or more hop transmissions crossing the different channels to allocate the at least two applications to a memory bank of the cluster to maximize a bandwidth usage of the memory bank. In particular embodiments, the SoC is further configured to, in response to determining that the first bandwidth demand of the first set of the applications is not less than the first cluster bandwidth capacity in the first cluster, determine a second bandwidth demand for a second set of applications from a second channel; and partition the second bandwidth demand to allocate at least one application from the first cluster to the second cluster. The at least one application from the first cluster represents a part of an aggregated traffic of a cross-cluster bandwidth. The aggregated traffic of the cross-cluster bandwidth is within a second bandwidth threshold. In particular embodiments, a channel bandwidth capacity associated with each cluster has a first bandwidth threshold.

In particular embodiments, the SoC is further configured to allocate one or more applications to one or more memory banks in the cluster; and select and send a read command or a write command across the set of the memory banks for implementing the one or more applications.

In particular embodiments, the SoC is further configured to partition the first bandwidth demand to one or more memory banks of the first cluster based on the set of the characteristics associated with each memory bank. The set of the characteristics comprises a size, a type, and a locality of the memory bank. The memory controller of the SoC does not use a physical interface (PHY) circuitry to access the 3D stacked memory. The SoC and the 3D stacked memory are vertically stacked together. The plurality of the memory banks each has a page size of 512 bytes or less. The plurality of the memory banks include at least eight memory banks. The plurality of the channels are controlled by using unidirectional and/or bidirectional links. Each channel may operate at 500 MHz or less.

In particular embodiments, artificial reality devices and methods may provide a headset which includes a memory page configuration and a low power DRAM with a customized memory controller for achieving high efficiency on a 3D stacked memory. A headset comprises a camera, a 3D stacked memory configured to store image data captured by the camera, and a System-on-Chip (SoC) configured to process the image data stored in the 3D stacked memory. The 3D stacked memory comprises a plurality of first drivers/receivers and a plurality of memory banks that are accessible in parallel. Each memory bank is accessible via a corresponding first interconnect. The SoC comprises a memory controller with a plurality of second drivers/receivers. The plurality of the second drivers/receivers are respectively connected to the plurality of the first drivers/receivers of the 3D stacked memory by a plurality of channels. In particular embodiments, the SoC and the 3D stacked memory are vertically stacked together. The plurality of the memory banks each has a page size of 512 bytes or less. The plurality of the memory banks include at least eight memory banks. The plurality of the channels are controlled by using unidirectional and/or bidirectional links. Each channel may operate at 500 MHz or less at a lower speed. In particular embodiments, the memory controller of the SoC does not use a physical interface (PHY) circuitry to access the 3D stacked memory. The 3D stacked memory does not use a Double Data Rate (DDR) interface and it does not require to perform impedance matching when transferring data from the plurality of the memory banks to the SoC.

In particular embodiments, the SoC does not use a dedicated phase-locked loop (PLL) or a delay-locked loop (DLL) for reading data from the memory banks. The SoC and the 3D stacked memory operate at different voltages. The memory controller is configured to operate as a scheduler to select and send read commands or write commands to the memory bank. An areal density of the plurality of the first drivers/receivers on the memory die is determined based at least in part on a threshold of a channel capacity and a predefined page size. The plurality of the memory banks are based at least in part on the areal density of the plurality of the first drivers/receivers. The number of pages of each memory bank is determined based at least in part on the threshold of a channel capacity and the number of the channels. The number of the plurality of the first drivers/receivers is determined based at least in part on the page size of each memory bank and the areal density of the plurality of the first drivers/receivers on the memory die.

Figure 2:
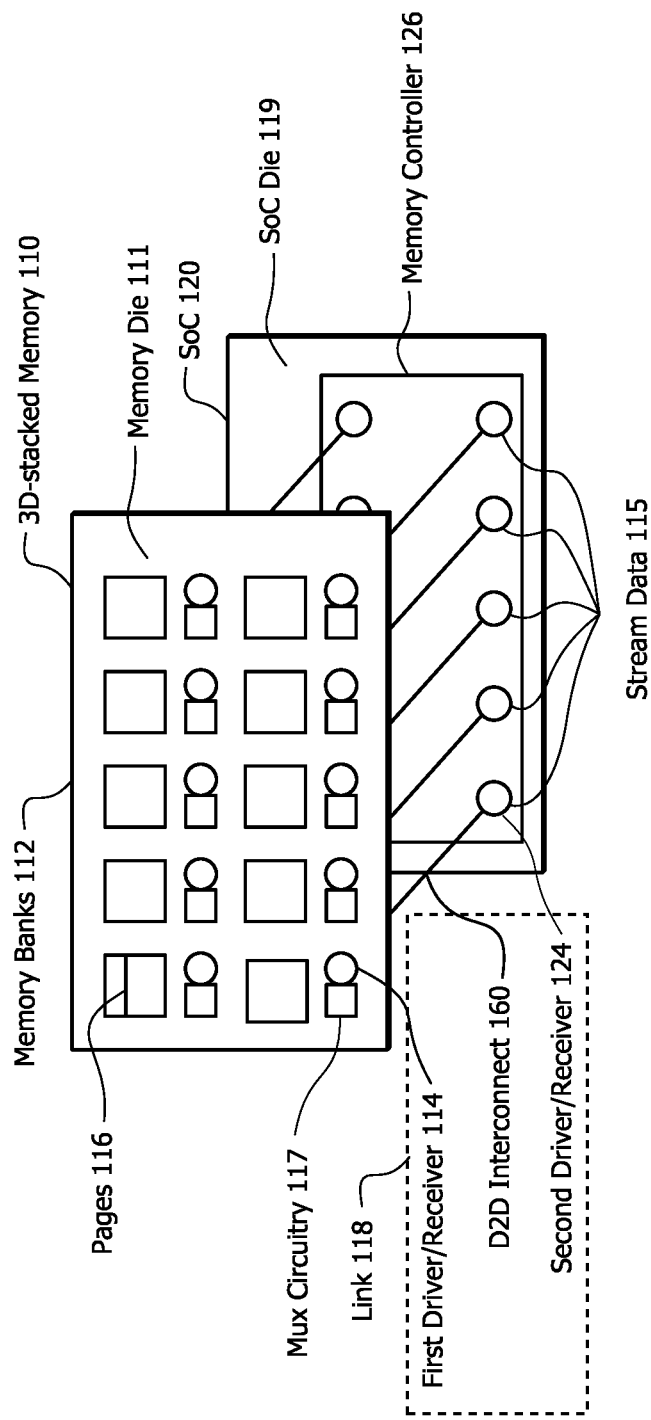
FIG. 2 is a diagram illustrating an example micro-architecture with the 3D stacked memory and the SoC of the headset.

FIG. 1 is a diagram illustrating a structure of an example headset 100 with a 3D stacked memory 110 and a System-on-Chip (SoC) 120. FIG. 2 is a diagram illustrating an example micro-architecture with the 3D stacked memory and the SoC 120 of the headset 100.

In particular embodiments, the example headset 100 may include a 3D stacked memory 110, a SoC 120, and a camera 150. The headset 100 is Head-Mounted Display (HMD) that presents content to a user. The headset 100 may include, but not limited to, VR headsets, AR headset, VR glasses, AR glasses, or of any other suitable architecture. The 3D stacked memory 110 may be configured to store image data captured by the camera 150. As illustrated in FIG. 2, the 3D stacked memory 110 may include a plurality of first drivers/receivers 114 and a plurality of memory banks 112 inside a memory die 111. The plurality of the second drivers/receivers 124 on the SoC die 119 may be respectively connected to the plurality of the first drivers/receivers 114 on the 3D stacked memory 110 through a plurality of Die-to-Die (D2D) connections 160. The 3D stacked memory 110 may be accessible in parallel through a plurality of Die-to-Die (D2D) connections 160. Each memory bank 112 of the 3D stacked memory 110 may be accessible via a corresponding unidirectional and/or bidirectional link 118 (e.g., link 118 in FIG. 2). In particular embodiments, the plurality of the memory banks 112 each may have a plurality of pages 116 (e.g., memory pages). Each page 116 may have a page size of 512 bytes or less. In particular embodiments, the plurality of the memory banks 112 may include at least eight memory banks 112.

In particular embodiments, the SoC 120 may be configured to process the image data stored in the 3D stacked memory 110. The SoC 120 may include a Network-on-chip (NoC) 130 and a memory controller 126. The SoC 120 may be connected to a SoC die 119 with a plurality of second drivers/receivers 124. The SoC 120 on the SoC die 119 and the 3D stacked memory 110 on the memory die 111 may be vertically stacked together. The plurality of the memory banks 112 may be accessed by a plurality of channels 134 which are connected to the NoC 130 on the SoC die 119. The memory die 111 may include multiplexer (Mux) circuitry 117 which is coupled to the plurality of the memory banks 112. The data movement between die circuitry may happen via unidirectional and/or bidirectional links 118 through the Mux circuitry 117. As illustrated in FIG. 2, each unidirectional and/or bidirectional link 118 may comprise a first driver/receiver 114, a D2D interconnect 160, and a second driver/receiver 124. The first driver/receiver 114 (e.g., the first driver with receiver) represents a first circuit element which is connected to the memory die 111 and configured to transfer data between the memory die 111 and the SoC die 119. The second driver/receiver 124 (e.g., the first driver with receiver) represents a second circuit element which is connected to the Soc die 119 and configured to transfer data between the memory die 111 and the SoC die 119. Each channel 134 may operate at 500 MHz or less. The plurality of unidirectional and/or bidirectional links 118 may be configured to control the plurality of the channels 134 to access the plurality of the memory banks 112.

In particular embodiments, the headset 100 may include a customized 3D stacked memory with a memory page configuration and a low power DRAM die. In the micro-architecture illustrated in FIG. 2, a memory die 111 and a SoC die 119 may be vertically stacked together through Die-to-Die (D2D) connections 160. In particular embodiments, the memory controller 126 of the SoC 120 does not use a physical interface (PHY) circuitry to access the 3D stacked memory 110. The 3D stacked memory 110 does not use a Double Data Rate (DDR) interface to perform impedance matching and it does not require when transferring stream data 115 from the plurality of the memory banks 112 to the SoC 120. In particular embodiments, the short D2D interconnects 160 may have a low capacitance profile which may enable the use of low-power and low-voltage links 118. The plurality of the channels 134 may be controlled by using unidirectional and/or bidirectional links 118. Each channel 134 may operate at 500 MHz or less at a lower speed. In particular embodiments, the short D2D interconnects 160 may have a low capacitance value less than 1 pF. Stream data 115 may be multiple low-speed parallel stream data and be transferred through the short D2D interconnects 160 between the plurality of the memory banks 112 and the SoC 120. The impedance matching is not needed for the low-speed interface and the short D2D interconnects 160 between the memory die 111 and the SoC die 119.

In particular embodiments, the SoC 120 does not use a dedicated phase-locked loop (PLL) or a delay-locked loop (DLL) for reading data from the memory banks 112. In particular embodiments, the SoC 120 chip and the 3D stacked memory 110 operate at different voltages. In particular embodiments, the memory controller 126 is configured to operate as a scheduler to select and send read commands or write commands to the memory bank.

In particular embodiments, the memory die 111 may be a customized low power DRAM die. An areal density of the plurality of the first drivers/receivers 114 on the memory die 111 may be determined based at least in part on a channel capacity threshold and a predefined page size. The plurality of the memory banks 112 may be determined based at least in part on the areal density of the plurality of the first drivers/receivers 114. The number of pages of each memory bank may be determined based at least in part on the channel capacity threshold and the number of the channels 134. The number of the plurality of the first drivers/receivers 114 may be determined based at least in part on the page size of each memory bank and the areal density of the plurality of the first drivers/receivers 114 on the memory die 111. The customized 3D stacked memory may have a small page size of the DRAM memory page of the DRAM on the memory die 111. A memory bank 112 with the smaller page size may be implemented based on an areal density of the plurality of the first drivers/receivers 114 on the memory die 111. The plurality of the memory banks 112 of the 3D stacked DRAM may each have a small page size of 512 B or less.

Figure 3:
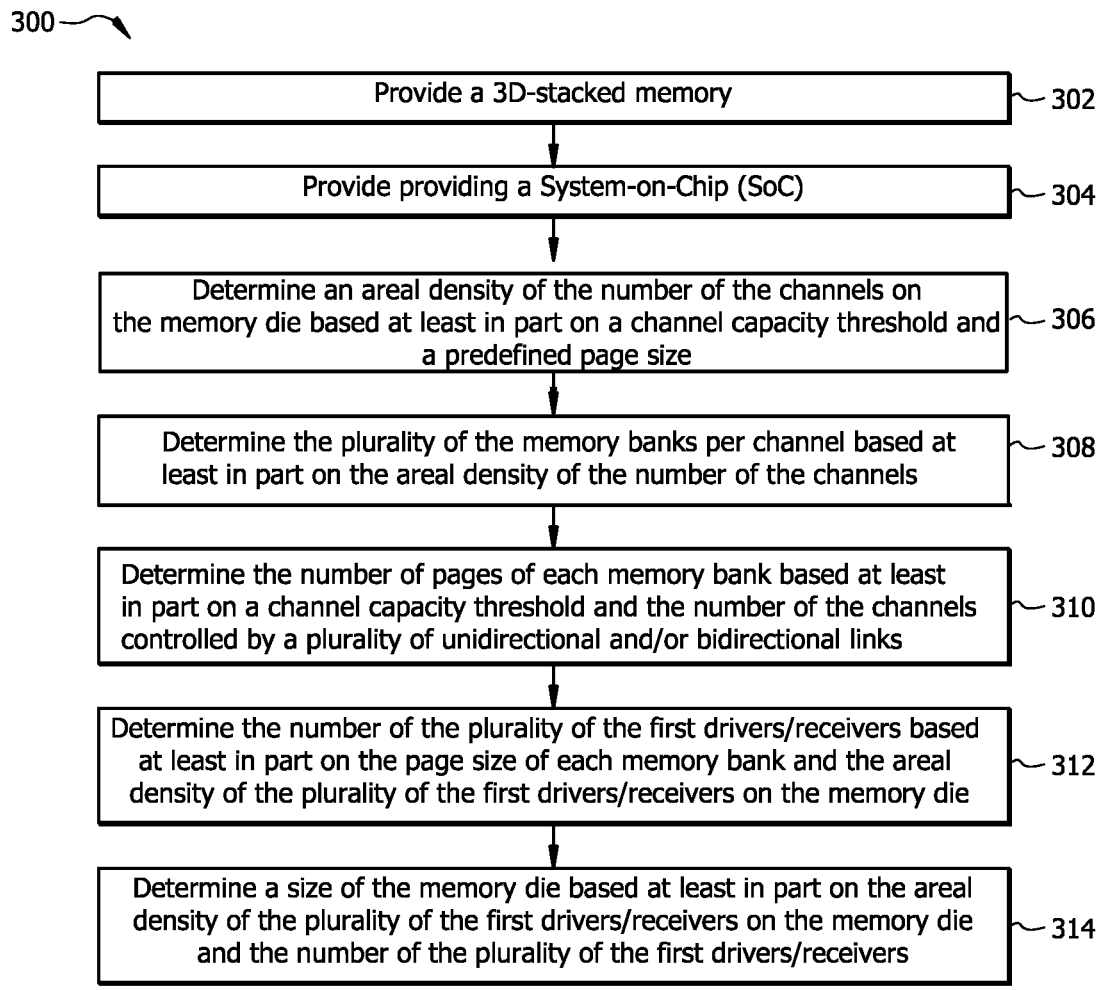
FIG. 3 illustrates an example method for producing a customized 3D stacked memory of the headset.

FIG. 3 illustrates an example method 300 for producing a customized 3D stacked memory of the headset 100. In particular embodiments, the steps 302-314 may be implemented to provide a customized 3D stacked memory page configuration and a low power DRAM die.

At step 302, a 3D stacked memory 110 may be provided and connected to the memory die 111. The 3D stacked memory 110 may be configured to store image data captured by a camera 150 of the headset 100. The 3D stacked memory 110 may include a plurality of first drivers/receivers 114 and a plurality of memory banks 112. The plurality of the memory banks 112 may be accessible by a plurality of channels 134 in parallel. The plurality of channels 134 may be connected to the NoC 130 which is connected to the SoC die 119. Each memory bank 112 may be accessible via a corresponding first driver/receiver 114 connected to the SoC die 119.

At step 304, a SoC 120 may be provided and configured to process the image data stored in the 3D stacked memory 110. The SoC 120 may include a memory controller 126 and a plurality of second drivers/receivers 124 which are connected to SoC die 119. The plurality of the second drivers/receivers 124 may be respectively connected to the plurality of the first drivers/receivers 114 of the 3D stacked memory 110. The 3D stacked memory 110 may are accessed by the plurality of the channels 134 controlled by the plurality of unidirectional and/or bidirectional links 118.

In particular embodiments, a customized 3D stacked memory may be implemented with a memory page configuration and a low power DRAM die. The headset may further provide a customized 3D stacked memory with a memory page configuration. The 3D stacked memory 110 may use a 3D stacked DRAM. For example, the channel may have a low channel capacity threshold, such as 8 MB-16 MB. Given the channel capacity threshold, the memory page configuration may reduce a page size of each memory bank 112 to 512 B. The headset 100 may provide an efficient interface associated with the NoC 130 of the SoC 120 with a lower channel capacity.

At step 306, an areal density of the plurality of the number of the channels 134 on the memory die 111 may be determined based at least in part on a channel capacity threshold and a predefined page size.

At step 308, the plurality of the memory banks 112 may be determined based at least in part on the areal density of the number of the channels 134 on the memory die 111. In particular embodiments, specific numbers of memory banks may be determined based on based at least in part on the areal density of the plurality of the first drivers/receivers 114 on the memory die 111.

At step 310, the number of pages of each memory bank may be determined based at least in part on the channel capacity threshold and the number of the channels 134 controlled by a plurality of unidirectional and/or bidirectional links 118.

At step 312, the numbers of the plurality of the first drivers/receivers 114 may be determined based at least in part on the page size of each memory bank and the areal density of the plurality of the first drivers/receivers 114 on the memory die 111.

At step 314, a size of the memory die 111 may be determined based at least in part on the areal density of the plurality of the first drivers/receivers 114 on the memory die 111 and the numbers of the plurality of the first drivers/receivers 114.

In particular embodiments, the method 300 may be implemented to determine optimal parameters of a page size, a die size, a number of channels, a number of D2D interconnects 160 between the memory die 111 to the SoC die 119, and an I/O width. Given a low power consumption, more channels for transferring data may be included between the memory die 111 and the SoC die 119 within a small die area of the memory die 111 of the 3D stacked memory 110. In particular embodiments, the method 300 may be implemented to determine the optimal parameters of the page size, the die size, the number of channels, and the number of D2D interconnects based on a tradeoff analysis for the related parameters.

In particular embodiments, the plurality of the memory banks 112 of the 3D stacked DRAM may each have a small page size of 512 B or less. The 3D stacked DRAM may statistically reduce the amount of data which may be transferred through memory arrays of the 3D stacked memory 110. The 3D stacked DRAM with the small page size significantly lowers the activation power and reduces the number of banks to 8 memory banks 112 used in the 3D stacked DRAM.

In particular embodiments, the SoC 120 on the SoC die 119 and the 3D stacked memory 110 the memory die 111 are vertically stacked together through a plurality of short D2D interconnects 160 with a low capacitance value less than 1 pF. The utilization of the short D2D interconnects 160 with a low capacitance value also enables the use of low-power and low-voltage input-output drivers. In particular embodiments, the plurality of the channels 134 may be controlled by using links unidirectional and/or bidirectional link 118. Each unidirectional and/or bidirectional link 118 comprises a first driver/receiver 114, a D2D interconnect 160, and a second driver/receiver 124. Each channel 134 may operate at 500 MHz or less. The data transferred from or to the SoC 120 may be completed through plurality of the channels 134 with a 500 MHz bandwidth. The memory page configuration and the low power DRAM die may also enable a low power consumption of the 3D stacked memory and reduce power consumption of the headset 100 in an artificial reality system.

In particular embodiments, different applications or services may run in a cluster 140. Different types of RAMs may be suitable for different types of application or services. Some applications and services may not allow or require data transaction between different clusters 140 of the 3D stacked memory 110. Memory partition and allocation may cause the applications or services provided by application producers to interact with a user occur within a cluster 140.

Figure 4:
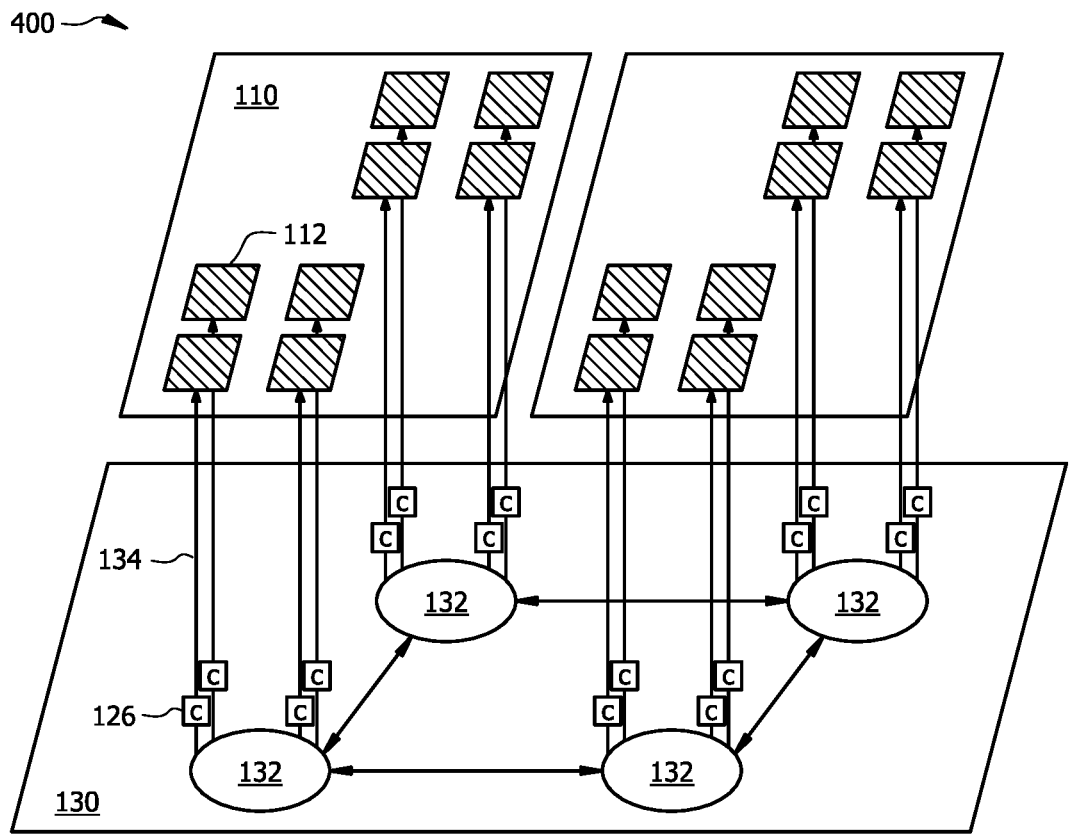
FIG. 4 is a diagram illustrating a Network-on-chip (NoC) topology with the 3D stacked memory of the headset.
Figure 5:
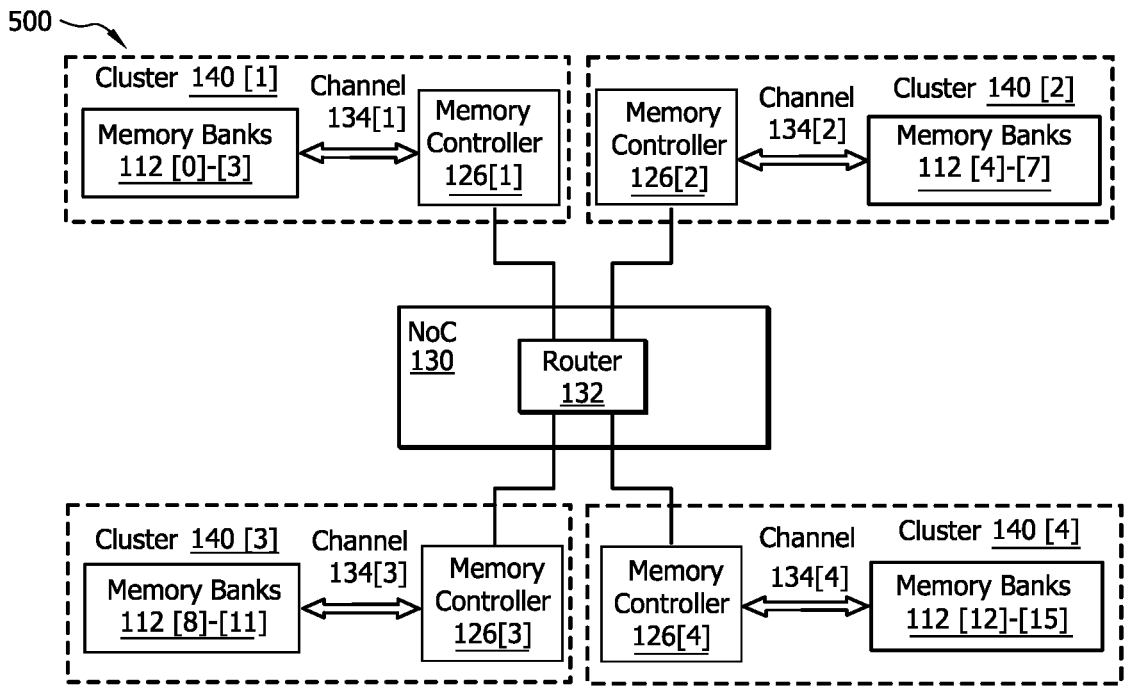
FIG. 5 is a diagram illustrating an example NoC architecture to handle multi-channel traffic of the 3D stacked memory of the headset.

FIG. 4 is a diagram illustrating a NoC topology 400 with the 3D stacked memory 110 of the headset 100. FIG. 5 is a diagram illustrating an example NoC architecture 500 to handle multi-channel traffic of the 3D stacked memory 110 of the headset 100.

In particular embodiments, the example headset 100 may include a 3D stacked memory 110 and a SoC 120. As illustrated in FIG. 4, the NoC topology 400 may include a plurality of routers 132. Each router 132 in the NoC topology 400 may be connected to a plurality of channels 134. Each channel 134 may be respectively connected to a memory bank 112 of the 3D stacked memory 110 on the memory die 111. As illustrated in the example NoC architecture 500 in FIG. 5, each router 132 may be connected to four channels 134[1]-[4]. Each channel 134 may be respectively connected to a cluster 140 of corresponding memory banks 112. For example, a channel 134[1] may be respectively connected to a cluster 140[1] of corresponding memory banks 112[0]-[3] and be associated with a memory controller 126[1]. In another example, a channel 134[2] may be associated with a memory controller 126[2] and be connected to a cluster 140[2] of memory banks 112[4]-[7].

In particular embodiments, the plurality of the routers 132 in the NoC topology 400 may be organized in a ring topology as illustrated in FIG. 4. The NoC topology 400 may provide a mechanism to allocate a plurality of applications or services to a channel corresponding to a dedicated cluster 140. The cluster 140 may include a group of four memory banks 112 of the 3D stacked memory 110. The NoC topology 400 may provide channel level parallelism in an AR or VR SOC for improved the bandwidth and lower latency of the 3D stacked memory 110. The NoC topology 400 may allow to meet workload performance in each cluster 140 without interferences from other workloads running on the SOC.

Figure 6:
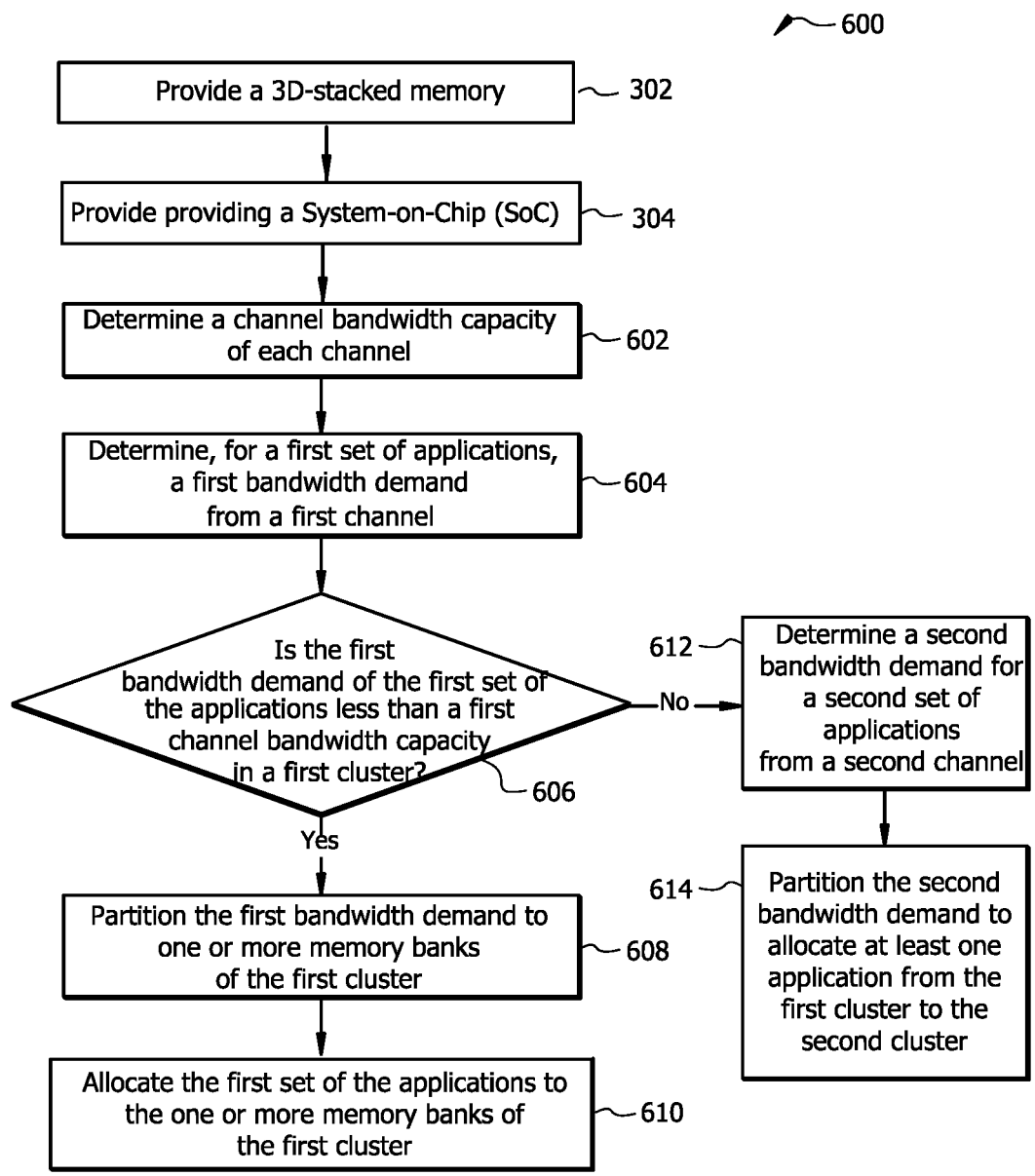
FIG. 6 illustrates an example method for handling multi-channel traffic of the 3D stacked memory of the headset.

FIG. 6 illustrates an example method 600 for handling multi-channel traffic of the 3D stacked memory 110 of the headset 100. Based on the NoC topology 400 and corresponding NoC architecture 500, the method 600 may provide solutions to cluster the customized 3D stacked memory to maximize bandwidth and minimize cross cluster communications based on the type of memory and types of applications or services. The method 600 may provide solutions to dynamically allocate a set of the applications to the one or more memory banks 112 of a cluster 140 to maximize a bandwidth usage of at least one memory bank 112 of the cluster 140. The dynamic allocation may be implemented based on a configuration of the SoC 120 with various subsystems to provide software instructions executed by a memory controller 126. The various subsystems may include specialized hardware and integrated circuits and software instructions to facilitate the functions of the headset. In particular embodiments, the subsystems may be functional subsystems operating on one or more processors or memory controllers to execute the software instructions or integrated circuits to implement the functions described herein. The method 600 may include the same steps 302-304 from FIG. 3 and the continuation steps 602-614.

Referring back to step 302, a 3D stacked memory 110 may be provided and connected to the memory die 111. The 3D stacked memory 110 may include a plurality of memory banks 112 that are accessible by a plurality of channels 134 in parallel. The 3D stacked memory 110 may be configured to store image data captured by a camera 150 of the headset 100. The plurality of channels 134 may be connected to the NoC 130 which is connected to the SoC die 119.

Referring back to step 304, a SoC 120 may be provided and configured to process the image data stored in the 3D stacked memory 110. The 3D stacked memory 110 may be accessed by the plurality of the channels 134 which are controlled by the plurality of unidirectional and/or bidirectional links 118. The SoC 120 may include a plurality of memory controllers 126 and a NoC 130. The NoC 130 may include a plurality of routers 132 each being connected to a plurality of channels 134. Each channel 134 may be respectively connected to a cluster 140 of memory banks 112.

At step 602, the SoC 120 may be configured to determine a channel bandwidth capacity of each channel associated with each cluster 140 as illustrated in the example NoC architecture 500 in FIG. 5. FIG. 7 is a diagram illustrating a traffic profile for each cluster 140 corresponding to the example NoC architecture 500 in FIG. 5 and the method 600 in FIG. 6. As shown in FIG. 7, applications or services may run in a cluster 140. Each application or service may be associated with a corresponding application producer or a virtual initiator. Each application or service associated with the virtual initiator may correspond to or require a reading bandwidth (Rd BW) value and a writing bandwidth (Wr BW) value. The reading bandwidth (Rd BW) value may be a range of bandwidth values. The writing bandwidth (Rd BW) value may be a range of corresponding bandwidth values. For example, an application of a computer vision (IP1) associated with a virtual initiator running in cluster 1 may require a reading bandwidth (Rd BW) value and a writing bandwidth (Wr BW) value. An example reading bandwidth (Rd BW) demand may be a range of 2000 MB/s to 3000 MB/s. An example writing bandwidth (Wr BW) demand may be a range of 500 MB/s to 1000 MB/s. For example, the total of the reading bandwidth (Rd BW) demand is 7368 MB/s in the cluster 1. The total of the reading bandwidth (Rd BW) demand is 3293 MB/s in the cluster 1. The total of the aggregated bandwidth demand in the cluster 1 is 10.66 GB/s which is less than 16 GB/s. Each bandwidth value may be associated with a corresponding type of memory, such as dynamic random access memory (DRAM) and static random-access memory (SRAM). Different types of memories may be suitable for different types of application or services. In particular embodiments, the 3D stacked memory 110 requires that an channel bandwidth capacity associated with each cluster 140 is less than 16 GB/s. In particular embodiments, the SoC 120 may be configured to determine a set of bandwidth values for an application corresponding to different types of memories in a cluster 140.

At step 604, the SoC 120 may be configured to determine a first bandwidth demand for a first set of applications of a subsystem from a first channel 134[1] via a first channel 134[1] associated with a first cluster 140[1]. In particular embodiments, at least one application from the first cluster represents a part of an aggregated traffic of a cross-cluster bandwidth. The channel bandwidth capacity associated with each cluster has a first bandwidth threshold, such as 16 GB/s. The aggregated traffic of the cross-cluster bandwidth is required to be within a second bandwidth threshold, such as 8 GB/s. The amount of memory bandwidth required may be dependent on the type of applications or services.

At step 606, the SoC 120 may be configured to determine whether the first bandwidth demand of the first set of the applications of the subsystem is less than a first channel bandwidth capacity associated with or in a first cluster 140[1]. In particular embodiments, a channel bandwidth associated with each cluster has a first bandwidth threshold of 16 GB/s. For example, a VR based application may require at least memory bandwidth of 16 GB/s.

At step 608, in response to determining that the first bandwidth demand of the first set of the applications of the subsystem is less than a first channel bandwidth capacity of the first channel in the first cluster 140[1], the SoC 120 may be configured to partition the first bandwidth demand to one or more memory banks 112 of the first cluster 140[1] based on a bandwidth demand of each application, the first channel bandwidth capacity, and/or a bandwidth density of the first channel 134[1]. The bandwidth density may represent a reuse factor of a channel and be defined as one over the number of memory banks in a cluster. Based on the first channel bandwidth capacity and the first channel bandwidth density, the SoC 120 may be configured to determine whether to allocate one or more applications associated with corresponding virtual initiators to the 3D stacked memory 110 at all or to allocate one or more applications to a SRAM or a conventional DRAM. For example, one application may be more suited to use a SRAM or a conventional DRAM.

In particular embodiments, the SoC 120 may be configured to partition the first bandwidth demand to one or more memory banks 112 of the first cluster 140[1] based on one or more characteristics associated with each memory bank 112. The set of the characteristics associated with each memory bank may include a size, a type, and a locality of the memory banks 112. The SoC 120 may be configured to store relationships between corresponding application producers and users of data associated with the applications to ensure that the localities of the memory banks 112 associated with the corresponding applications are maintained in the same cluster 140.

At step 610, the SoC 120 may be configured to allocate the first set of the applications to the one or more memory banks 112 of the first cluster 140[1]. In particular embodiments, the SoC 120 may be configured to allocate the first set of the applications to the one or more memory banks 112 of the first cluster 140[1] based on the types of applications or services to maximize a bandwidth usage of at least one memory bank 112 of the first cluster 140[1]. In particular embodiments, the applications or services within each cluster 140 may be selected based on bandwidth requirements of the applications and how the application producer and a user of data associated with the application are related to each other. For example, the SoC 120 may be configured to determine an affinity score between an application producer and a user of data associated with the application associated with a cluster 140. The one or more memory banks 112 may store the affinity score representing relationships between corresponding application producers and users of data associated with the first set of the applications. The user associated with the headset 100 may initiate the application. The SoC 120 may be configured to partition the first bandwidth demand to one or more memory banks 112 of the first cluster 140[1] based on a ranking of one or more affinity scores associated with the applications and the bandwidth demand of each application in the cluster 140[1]. Further, the SoC 120 may be configured to allocate the first set of the applications to the one or more memory banks 112 of the first cluster 140[1] to maximize a bandwidth usage of at least one memory bank 112 of the first cluster 140[1].

In particular embodiments, the SoC 120 may be configured to identify at least two applications associated with the same virtual initiator. The at least two applications may be transmitted by a router 132 via different channels 134 each associated with a cluster 140. The SoC 120 may be configured to enable channel interleaving to generate one or more hop transmissions crossing the different channels 134 to allocate the at least two applications to a memory bank 112 of the cluster 140 to maximize a bandwidth usage of the memory bank 112.

At step 612, in response to determining that the first bandwidth demand of the first set of the applications of the subsystem is not less than a first channel bandwidth capacity of the first channel in the first cluster 140[1], the SoC 120 may be configured to determine a second bandwidth demand for a second set of applications of the subsystem from a second channel 132[2] associated with a second cluster 140[2].

At step 614, the SoC 120 may be configured to partition the second bandwidth demand to allocate at least one application from the first cluster 140[1] to the second cluster 140[2]. Two related applications or services may be allocated to different clusters 140 of the 3D stacked memory 110 based on the bandwidth values. The 3D stacked memory 110 requires that an aggregated traffic of the cross-cluster bandwidth is within a second bandwidth threshold of 8 GB/s.

In particular embodiments, the SoC 120 may be further configured to allocate one or more applications to one or more memory banks 112 in the clusters 140. The SoC 120 may be further configured to select and send a read command or a write command across the set of the memory banks 112 for implementing the one or more applications.

The memory partition and allocation implemented in the method 600 may cause an application or related applications provided to a user to occur within a cluster 140. Therefore, the application or the related applications do not require data transaction between different clusters 140. Further, VR applications may induce a large memory and memory bandwidth footprint. The memory partition and allocation implemented in the method 600 may reduce memory consumption or power consumption during runtime.

In particular embodiments, artificial reality devices and methods may provide a headset 100 which includes a memory page configuration and a low power DRAM with a customized memory controller 126 for achieving high efficiency on a 3D stacked memory of a headset 100. In particular embodiments, the memory controller 126 may be configured to be a content-addressable memory (CAM) based an out-of-order scheduler 128. The out-of-order scheduler 128 may be used to manage incoming read/write commands and selectively issue the corresponding commands to the 3D stacked memory 110. The operation may optimize the operation efficiency within a page 116 of a memory bank 112. For example, multiple operations may be performed on data within the same page even though the operations are not received in a sequential order. Further, the out-of-order scheduler 128 may be used with 4 memory banks on the 3D stacked memory 110 to reduce the power-consumption and the size of a scheduler to meet high bandwidth efficiency of the headset 100.

Referring back to FIG. 1, a headset 100 may include a camera 150, a 3D stacked memory 110, and a SoC 120. The 3D stacked memory may be configured to store image data captured by the camera 150. The 3D stacked memory 110 may include a plurality of memory banks 112 that are accessible in parallel via the plurality of channels 134. The SoC 120 may include a plurality of memory controller 126 and a NoC 130 element. The SoC 120 and the 3D stacked memory 110 may be vertically stacked together. Each cluster 140 may include four memory banks 112. Each memory bank has a page size of 512 bytes or less.

Referring back to FIGS. 4-5, the NoC 130 may include a plurality of routers 132. Each router 132 may be connected to the plurality of the channels 134. Each memory controller 126 may be connected to a cluster 140 of memory banks 112. Each memory controller 126 may be configured to operate as an out-of-order scheduler 128 to access each respective memory bank 112 via a channel 134.

Figure 8:
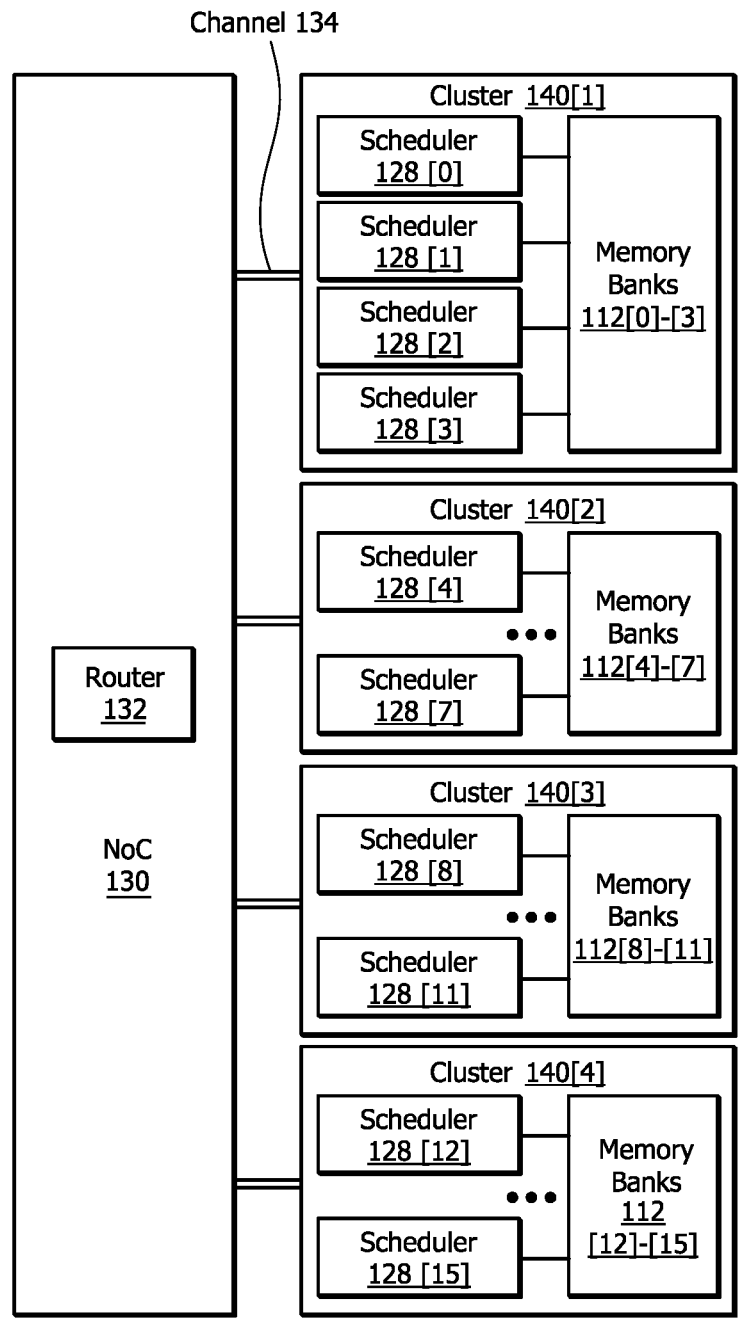
FIG. 8 is a diagram illustrating an example micro-architecture of an out-of-order scheduler used for the 3D stacked memory of the headset.

FIG. 8 is a diagram illustrating an example micro-architecture of an out-of-order scheduler 128 used for the 3D stacked memory 110 of the headset 100. Each router 132 may be connected to four channels 134. Each out-of-order scheduler 128 may be associated with a channel 134 and may be respectively connected to a cluster 140 of memory banks 112. For example, a channel 134 may be associated with the out-of-order schedulers 128[0]-[3]. In the cluster 140[1], the set of out-of-order schedulers 128[0]-[3] may be connected to respective memory banks 112[0]-[3]. Similarly, In the cluster 140[2], the set of out-of-order schedulers 128[4]-[7] may be connected to respective memory banks 112[4]-[7]. Each memory bank 112 may be a part of a customized 3D stacked memory 110 with a memory page configuration and a low power DRAM die as described above. The out-of-order scheduler 128 may be configured to generate a schedule with an out-of-order sequence of read commands and write commands to control operations and memory traffic of a set of memory banks 112 in each cluster 140.

Figure 9:
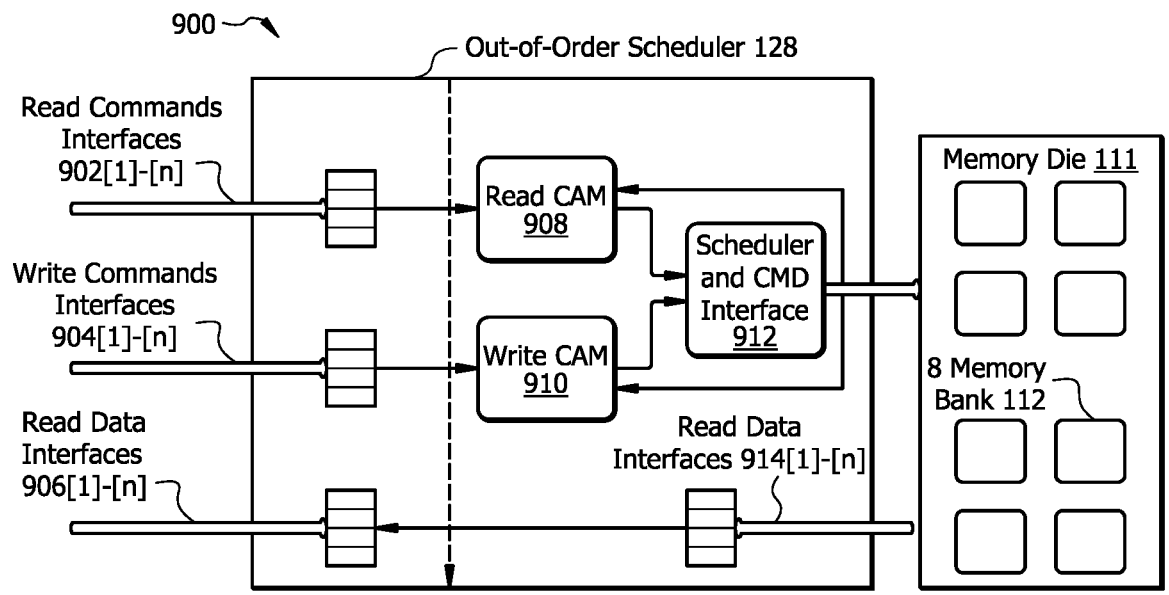
FIG. 9 is a functional diagram of an example system using an out-of-order scheduler to manage read and write commands for the 3D stacked memory.

FIG. 9 is a functional diagram of an example system 900 using an out-of-order scheduler 128 to manage read or write commands for the 3D stacked memory 110. In particular embodiments, the system 900 may include an example out-of-order scheduler 128 connected to a set of memory banks 112. The out-of-order scheduler 128 is a content-addressable memory (CAM) based scheduler and includes a set of functional circuit elements. The set of the functional circuit elements may include read commands interfaces 902[1]-[n], write commands interfaces 904[1]-[n], read data interfaces 906[1]-[n], a read CAM 908, a write CAM 910, a scheduler with a command (CMD) interface 912, and read data interfaces 914[1]-[n].

The write CAM 910 may be configured to operate as a write staging buffer to store incoming write commands inside the out-of-order scheduler 128 in response to write requests. The write commands may be queued to write data to at least one memory bank 112 of the 3D stacked memory 110 through a write commands interface 904. The scheduler 128 may be configured to maintain open transactions per open page. The out-of-order scheduler 128 may be configured to maintain memory bank status to indicate which memory banks are open or closed. The read CAM 908 may be configured to operate as a read staging buffer to store incoming read commands for reading data from at least one memory bank 112 of the 3D stacked memory 110 through the read commands interface 902 in response to read requests. The out-of-order scheduler 128 may be configured to indicate whether the scheduler 128 issues write commands or read commands to a memory bank 112. The larger the memory banks, the larger the read command queues or write command queues will be. The read command queue for processing read requests is separate from the write command queue for processing write requests. The scheduler 128 may be configured to prioritize read commands and provide read command queue with a higher bandwidth compared to a write command queue. For example, the out-of-order scheduler 128 may prioritize instructions for page hits, support urgent requests, and minimize read-write switches. The system 900 may include an out-of-order scheduler 128 with a command interface 912 to schedule a read command or a write command to at least one memory bank 112 of the 3D stacked memory 110. The out-of-order scheduler 128 may read data from the memory bank 112 through read data interfaces 914[1]-[n] from the memory banks 112. The system 900 may include read data interfaces 906[1]-[n] for reading data from the read data interfaces 914[1]-[n].

Figure 10:
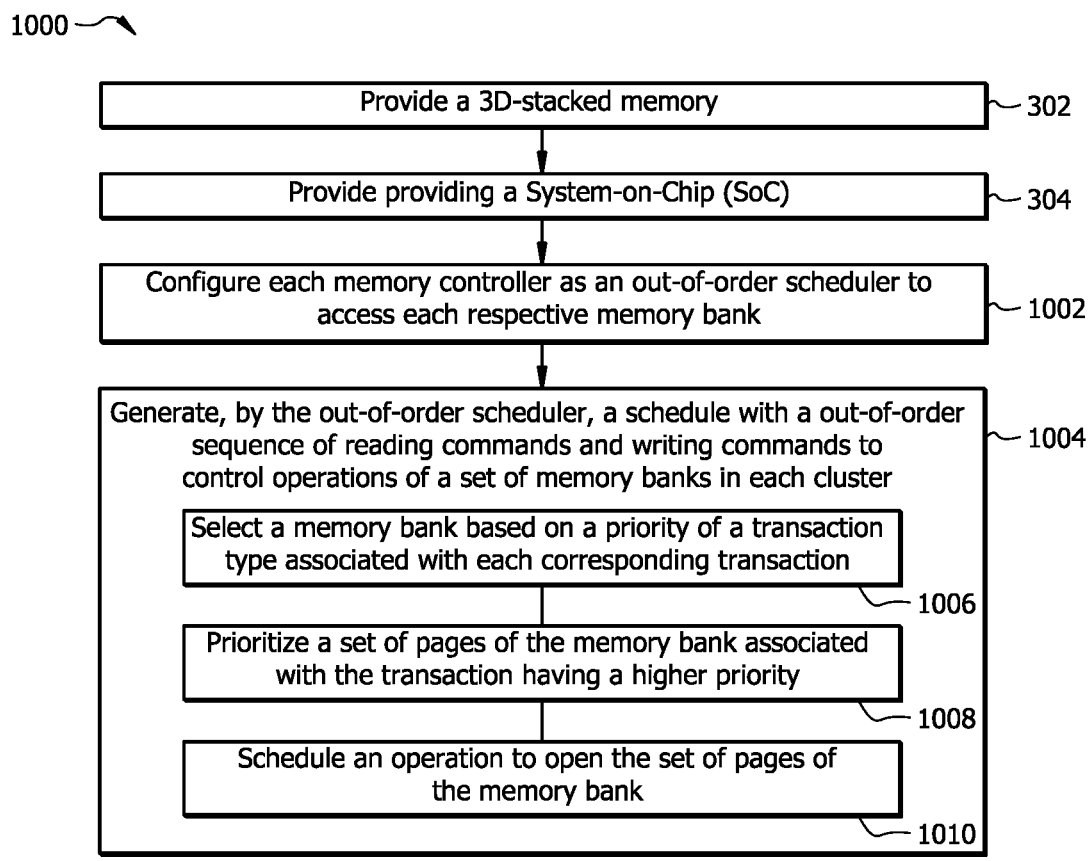
FIG. 10 illustrates an example method for using out-of-order schedulers to achieve high efficiency on the 3D stacked memory of the headset.

FIG. 10 illustrates an example method 1000 for using out-of-order schedulers 128 to achieve high efficiency by reducing power consumption and a memory size of the 3D stacked memory 110 of the headset 100. The method 1000 may include the same operations 302-304 from FIG. 3 and the continuation steps 1002-1010.

Referring back to step 302, a 3D stacked memory 110 may be provided and connected to the memory die 111. The 3D stacked memory 110 may include a plurality of memory banks 112 that are accessible by a plurality of channels 134 in parallel. The 3D stacked memory 110 may be configured to store image data captured by a camera 150 of the headset 100. The plurality of channels 134 may be connected to the NoC 130 which is connected to the SoC die 119.

Referring back to step 304, a SoC 120 may be provided on a SoC die 119 and configured to process the image data stored in the 3D stacked memory 110. The 3D stacked memory 110 may be accessed by the plurality of the channels 134 controlled by the plurality of unidirectional and/or bidirectional links 118. The SoC 120 may include a plurality of memory controllers 126 and a NoC 130. The NoC 130 may include a plurality of routers 132 each being connected to a plurality of channels 134. Each channel 134 may be respectively connected to a cluster 140 of memory banks 112. Each memory controller 126 may be associated with a channel 134 and be connected to a cluster 140 of memory banks 112.

At step 1002, each memory controller 126 may be configured to operate as an out-of-order scheduler 128 to access each respective memory bank 112. As illustrated in FIG. 9, an out-of-order scheduler 128 may be used to manage and selectively issue incoming read and write commands to one or more memory banks 112 of the 3D stacked memory 110. In particular embodiments, multiple operations on data within the same page 116 of a memory bank 112 may be performed together even though those operations are not received in sequential order.

At step 1004, the out-of-order scheduler 128 may be configured to generate a schedule with an out-of-order sequence of read commands or write commands to control operations of a set of memory banks 112 in each cluster 140. For example, the out-of-order scheduler 128 may selectively issue either read commands or write commands to the memory banks 112 to optimize the operation efficiency within a page 116 of a memory bank 112 while reducing the power-consumption. In particular embodiments, each out-of-order scheduler 128 may be configured to determine a priority to select a command. Commands may be selected based on page status.

In particular embodiments, commands to open some pages may be sent out ahead of commands to close other pages. Further, commands may be selected to improve efficiency. In particular embodiments, out-of-order scheduler 128 may be configured to set a read command priority of opening a memory bank 112 over another memory bank 112. For example, the out-of-order scheduler 128 may determine a priority of certain data stream over another data stream based on a user selection.

At step 1006, the out-of-order scheduler 128 may be configured to select a memory bank 112 based on a priority of a transaction type associated with each transaction. The transaction may be associated with an application or service which runs in a cluster 140. The application or service is initiated by an application producer to a user associated with the headset 100.

At step 1008, the out-of-order scheduler 128 may be configured to prioritize the pages 116 of the memory bank 112 associated with the higher priority transaction. The out-of-order scheduler 128 may be configured to determine a set of pages 116 of the memory bank 112 associated with the transaction having a higher priority. For example, selecting a memory bank 112 to send the command may be based on a higher priority transaction associated with the memory bank 112. In one embodiment, each out-of-order scheduler 128 may be further configured to select a memory bank 112 based on a request associated with a page 116 of the memory bank 112. In one embodiment, each out-of-order scheduler 128 may be further configured to select a memory bank 112 based on a data transfer direction to or from the memory bank 112. In one embodiment, each out-of-order scheduler 128 may be further configured to select a memory bank 112 based on page status, such as open or closed status.

At step 1010, the out-of-order scheduler 128 may be configured to schedule an operation to open the set of pages 116 of the memory bank 112. Each out-of-order scheduler 128 may be configured to determine whether there is a critical precharge command based on a timing cycle. In response to determining that there is no critical precharge command, each out-of-order scheduler 128 may be configured to schedule a write command or a read command. Each out-of-order scheduler 128 may further be configured to schedule a precharge command after the write command or the read command is executed. Each out-of-order scheduler 128 may be configured to schedule an activation command after the precharge command is executed.

In particular embodiments, each out-of-order scheduler 128 may be configured to determine a priority to select a command. Commands may be selected based on page status, such as an open status, closing status, or close status. In particular embodiments, commands to open a page 116 may be sent out ahead of commands to close a page 116. Further, commands may be selected to improve efficiency. In particular embodiments, out-of-order scheduler 128 may be configured to set a priority of a command to open a memory bank over sending a command to read another open bank.

Table 1 shows a traffic analysis of an out-of-order scheduler 128 associated with corresponding memory structure and memory area analysis. As shown in Table 1, the out-of-order scheduler 128 with 4 memory banks 112 in a cluster 140 meets bandwidth requirements for a 3D stacked memory 110. In particular embodiments, the 3D stacked memory 110 with 4 memory banks and the out-of-order schedulers 128 in the cluster 140 may provide 85% bandwidth efficiency and lower latency of the 3D stacked memory 110.

TABLE 1

| Memory | Memory Structure | Area | Bandwidth Efficiency | Average Latency |
|---|---|---|---|---|
| Baseline | 16 channels × 4 banks × 2 MB | 15.2 mm² | 60% | 239 ns |
| 8 Banks | 16 channels × 8 banks × 1 MB | 3.2 mm² | 70% | 167 ns |
| 4 Banks with an out-of-order scheduler | 16 channels × 4 banks × 2 MB | 1.248 mm² | 85% | 164 ns |

In particular embodiments, other advantages of using an out-of-order scheduler 128 may include managing incoming read and write commands and selectively issuing the corresponding commands to the 3D stacked memory 110 to optimize the operation efficiency within a page 116. The pages 116 may be configured to be open before the data is written to the pages 116. In particular embodiments, the process may increase the efficiency of data transmission of the data bus. Further, using out-of-order schedulers 128 in a 3D stacked memory 110 may further simplify a 3D stacked memory 110 with 4 memory banks 112 and 4 out-of-order schedulers 128 in a cluster 140, which decreases the scheduler size with improved power efficiency and lower density and further optimizes operating ranges with a bandwidth restrained within a certain limit.

In particular embodiments, a 3D stacked memory 110 with 4 memory banks 112 in a cluster 140 can provide enough performance for the traffic characteristics. With only 4 memory banks in each cluster 140, the size of the out-of-order scheduler 128 may be decreased to ⅛ of the size of a traditional scheduler. Therefore, the out-of-order scheduler 128 provides an efficient solution with a small size of a memory device.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A headset, comprising:
   a camera;
   a 3D stacked memory configured to store image data captured by the camera, the 3D stacked memory having a plurality of first drivers/receivers and a plurality of memory banks that are accessible in parallel, wherein each memory bank is accessible via a corresponding first driver/receiver; and
   a System-on-Chip (SoC) configured to process the image data stored in the 3D stacked memory, the SoC having a memory controller with a plurality of second drivers/receivers, wherein the plurality of the second drivers/receivers are respectively connected to the plurality of the first drivers/receivers of the 3D stacked memory by a plurality of channels,
   wherein:
   the SoC and the 3D stacked memory are vertically stacked together;
   the plurality of the memory banks each has a page size of 512 bytes or less;
   the plurality of the memory banks include at least eight memory banks; and
   the plurality of the channels are controlled by unidirectional and/or bidirectional links.

2. The headset of claim 1, wherein the memory controller of the SoC does not use a physical interface (PHY) circuitry to access the 3D stacked memory.

3. The headset of claim 1, wherein the 3D stacked memory does not use a Double Data Rate (DDR) interface and does not require to perform impedance matching when transferring stream data from the plurality of memory banks to the SoC.

4. The headset of claim 1, wherein the SoC does not use a dedicated phase-locked loop (PLL) or a delay-locked loop (DLL) for reading data from the memory banks, and wherein the SoC operates at the same frequency as a SoC clock.

5. The headset of claim 1, wherein the SoC and the 3D stacked memory operate at different voltages, and each channel operates at 500 MHz or less.

6. The headset of claim 1, wherein the memory controller is configured to operate as a scheduler to select and send read commands or write commands to the memory bank.

7. The headset of claim 6, wherein an areal density of the number of the channels on a memory die is determined based at least in part on a threshold of a channel capacity and a predefined page size.

8. The headset of claim 7, wherein the plurality of the memory banks is based at least in part on the areal density of the plurality of the number of the channels.

9. The headset of claim 7, wherein the number of pages of each memory bank is determined based at least in part on a channel capacity threshold and the number of the channels.

10. The headset of claim 9, wherein the numbers of the plurality of the first drivers/receivers are determined based at least in part on the page size of each memory bank and an areal density of the plurality of the first drivers/receivers on a memory die.

11. A method comprising:
providing a 3D stacked memory configured to store image data captured by a camera, the 3D stacked memory comprising a plurality of first drivers/receivers and a plurality of memory banks that are accessible by a plurality of channels in parallel, wherein each memory bank is accessible via a corresponding first driver/receiver; and
providing a System-on-Chip (SoC) configured to process the image data stored in the 3D stacked memory, the SoC comprising a memory controller with a plurality of second drivers/receivers, wherein the plurality of the second drivers/receivers are respectively connected to the plurality of the first drivers/receivers of the 3D stacked memory by the plurality of the channels,
wherein:
the SoC and the 3D stacked memory are vertically stacked together;
the plurality of memory banks each has a page size of 512 bytes or less;
the plurality of memory banks include at least eight memory banks; and
the plurality of the channels are controlled by a plurality of unidirectional and/or bidirectional links.

12. The method of claim 11, wherein the memory controller of the SoC does not use a physical interface (PHY) circuitry to access the 3D stacked memory.

13. The method of claim 11, wherein the 3D stacked memory does not use a Double Data Rate (DDR) interface and it does not require to perform impedance matching when transferring stream data from the plurality of memory banks to the SoC.

14. The method of claim 11, wherein the SoC does not use a dedicated phase-locked loop (PLL) or a delay-locked loop (DLL) for reading data from the memory banks.

15. The method of claim 11, wherein the SoC and the 3D stacked memory operate at different voltages, and each channel operates at 500 MHz or less.

16. The method of claim 11, wherein the memory controller is configured to operate as a scheduler to select and send read commands or write commands to the memory bank.

17. The method of claim 16, further comprising determining an areal density of the number of the channels on a memory die based at least in part on a threshold of a channel capacity and a predefined page size.

18. The method of claim 17, further comprising determining the plurality of the memory banks based at least in part on the number of the channels.

19. The method of claim 17, further comprising determining the number of pages of each memory bank based at least in part on a channel capacity threshold and the number of the channels.

20. The method of claim 19, further comprising:
determining the numbers of the plurality of the first drivers/receivers based at least in part on the page size of each memory bank and an areal density of the plurality of the first drivers/receivers on a memory die; and
determining a size of the memory die based at least in part on the areal density of the plurality of the first drivers/receivers on the memory die and the numbers of the plurality of the first drivers/receivers.

* * * * *